(12) United States Patent
Fan (10) Patent No.: US 10,211,188 B2
(45) Date of Patent: Feb. 19, 2019

(54) METHOD FOR MAKING AN LED MODULE AND MODULE MADE THEREOF

(71) Applicant: Cheng Chang TransFlexDisplay Corp., Hsinchu (TW)

(72) Inventor: Wen-Chang Fan, Hsinchu (TW)

(73) Assignee: Cheng Chang TransFlexDisplay Corp., Hsinchu (TW)

( * ) Notice: Subject to any disclaimer, the term of this patent is extended or adjusted under 35 U.S.C. 154(b) by 170 days.

(21) Appl. No.: 15/365,963

(22) Filed: Dec. 1, 2016

(65) Prior Publication Data

US 2018/0158805 A1 Jun. 7, 2018

(51) Int. Cl.
| | |
|---|---|
| *H05K 1/18* | (2006.01) |
| *H05K 3/24* | (2006.01) |
| *H05K 3/28* | (2006.01) |
| *H01L 33/62* | (2010.01) |
| *H01L 25/075* | (2006.01) |

(52) U.S. Cl.
CPC .......... *H01L 25/0753* (2013.01); *H01L 33/62* (2013.01); *H05K 1/189* (2013.01); *H05K 3/246* (2013.01); *H01L 2933/0066* (2013.01); *H05K 3/28* (2013.01); *H05K 2201/0108* (2013.01); *H05K 2201/0145* (2013.01); *H05K 2201/0154* (2013.01); *H05K 2201/10106* (2013.01)

(58) Field of Classification Search
CPC .................. H01L 33/62; H01L 25/0753; H01L 2933/0066; H01L 33/005; F21K 9/90; F21V 23/005; F21V 23/06; F21Y 2115/10; F21Y 2113/13
See application file for complete search history.

(56) References Cited

U.S. PATENT DOCUMENTS

| | | | | |
|---|---|---|---|---|
| 8,814,406 | B2 * | 8/2014 | Baur | H01L 24/24 362/545 |
| 9,196,584 | B2 * | 11/2015 | Ogata | H01L 23/5228 |
| 2002/0113246 | A1 * | 8/2002 | Nagai | F21K 9/90 257/99 |
| 2017/0370560 | A1 * | 12/2017 | Baldo | H05K 3/4038 |

* cited by examiner

*Primary Examiner* — Peggy A Neils (57) ABSTRACT

An LED module includes a substrate, a first conductive element formed on a top face of the substrate, wherein the first conductive element has a feature to bear at least 0.3 Amps of electrical current passing therethrough and conductive islands formed on a top face of substrate and one of which is electrically connected to the first conductive element. An insulation film is formed on a top face of the first conductive element and at least one patterned second conductive element is formed on the substrate to be electrically connected to the remainder of the conductive islands and crosses over the first conductive element at portions of the first conductive element having the insulation film formed thereon. An LED chip is mounted on the top face of the substrate to electrically connect to the first conductive element, the conductive islands and the patterned second conductive element.

16 Claims, 13 Drawing Sheets

METHOD FOR MAKING AN LED MODULE AND MODULE MADE THEREOF

CROSS REFERENCE

N/A

TECHNICAL FIELD

The preferred embodiment of the present invention is related to a method for making an LED (light emitting diode) module and, more particularly, to an LED module made by the method.

BACKGROUND OF THE INVENTION

Light emitting diode (LED) has been used in the fields of lighting, display and many others for many years. Due to its high efficiency of power saving and great lighting affect, the application of LED has been widely spread throughout the industry as such, the corresponding new technologies of how the LED is made, packaged and applied are introduced to the world over and over again in the past years. The related art like: U.S. Pat. No. 9,231,171 related to an LED module, U.S. Pat. No. 9,179,543 related to the making of via in the substrate; U.S. Pat. No. 7,752,792 discussing about how two LED modules are combined and U.S. Pat. No. 6,893,890 concerning about the wires formed on a substrate is constantly developed to promote the technology to march toward a more economic and convenient way of making an LED module. However, reviewing these patents gives people an impression that all those patents or currently commercially available technology focus on the thin-film technology (TFT) or printed circuit board method (PCB). As well known in the art that when the method of making something is related to TFT, the base cost is high and the processes involved are complicated, which builds a high-wall to people who are interested to join or have interest in developing new technology.

Another technology involving LED is the Active-Matrix Organic Light Emitting Diode (AMOLED). Basically, the technology used in AMOLED is pretty much related to TFT, and the differences therebetween is that an organic phosphorous powder is used to generated required light through the activation of current. As said earlier, this technology is very closely related to TFT, which also sets a high bar to the industry. Even so, in order to pursuit high resolution, a newly developed technology called micro-LED is surfaced to simplify the problems that the OLED industry is facing, involving, but not limited to, the obtaining of organic phosphorous material, the packaging technology used to package the glass once the OLED module is completed . . . etc. The implementation of micro LED may actually solve some of the problems that OLED faces, however, the alignment of transfer of millions of electronic devices to another support substrate may still need time to really commercialize the technology. Still, to further simplify the TFT process, another technology is currently under development, i.e., printed electronics.

The attraction of printing technology for the fabrication of electronics mainly results from the possibility of preparing stacks of micro-structured layers (TFT) in a much simpler and cost-effective way compared to conventional electronics. Also, the ability to implement new or improved functionalities plays a role. The selection of the printing method used is determined by requirements concerning printed layers, by the properties of printed materials as well as economic and technical considerations of the final printed products.

Inkjets are flexible and versatile, and can be set up with relatively low effort. However, inkjets offer lower throughput and lower resolution. It is well suited for low-viscosity, soluble materials like organic semiconductors. Because ink is deposited via droplets, thickness and dispersion homogeneity is reduced. Using many nozzles simultaneously and pre-structuring the substrate allows improvements in productivity and resolution, respectively. However, in the latter case non-printing methods must be employed for the actual patterning step.

Screen printing is appropriate for fabricating electrics and this method can produce conducting lines from inorganic materials (e.g. for circuit boards and antennas), but also insulating and passivating layers, whereby layer thickness is more important than high resolution. This versatile and comparatively simple method is used mainly for conductive and dielectric layers, such as the conductive lines for the touch-screen. However, it is quite a feature for printing the conductive lines for the use of, i.e., touch screen. Due to the consideration of transparency for touch screen, the material for the conductive lines is primarily ITO (90% of Indium, 10% Tin oxide). This is largely used in the transparent conductive layer in the TFT for LCDs (liquid crystal display) or the touch screen for mobile phones or touch counsel for laptop computers. Because of the consideration of induced current generated by the capacitors that are located on the matrix of conductive lines and of the consideration of transparency, the electric current required for touch panel and passing through the conductive lines have to be transparent to allow users to see through the cover glass and a width capable of bearing only a small amount of current.

Still, there is a technology used widely in the electrical appliance industry, i.e., printed circuit board (PCB). The conductive wires are first printed on a carrier (substrate), then via is defined through the carrier to electrically connect the conductive wires on opposite sides of the carrier. The conductive wires of PCB may be transparent or opaque depending on the requirements. This technology has been used for many years and is widely acknowledged by the skilled person in the art. The PCB process, though widely implemented in different fields, still faces problems that bother the manufacturers, the heat dissipation. As the electronic devices take relatively a large amount of space on the carrier compared to the conductive lines, the heat generated by the electronic device needs to be dissipated in order to maintain great efficiency of the electronic devices. Therefore, the device responsible for heat dissipation takes another portion of inner space inside the entire assembly.

It is an objective of the preferred embodiment of the present invention to provide a method for making an LED module that is easy to proceed and maintain the transparency of the carrier to allow users to see through the carrier when not activated.

SUMMARY OF THE INVENTION

It is an objective of the preferred embodiment of the present invention to provide a method for making an LED module. The method comprises the steps of printing a first conductive element and conductive islands on a substrate, the first conductive element being electrically connected to at least one of the conductive islands and having a feature to allow at least 0.3 Amps of current passing through; printing an insulation film on top of portions of the first conductive element; printing a patterned second conductive element on the substrate and on top of the insulation film so that a portion of the patterned second conductive element crosses over the first conductive element at the portions of the first conductive element having the insulation film thereon such that the patterned second conductive element is on a same level with the first conductive element except the portions of the first conductive element having the insulation film thereon, the patterned second conductive element being electrically connected to rest of the conductive islands; and mounting an LED chip on the top face of the substrate to electrically connect to the conductive islands.

Another objective of the preferred embodiment of the present invention is that the substrate is flexible and light transmissive and made of a compound containing polyimide (PI), Polyethylene Naphtholate (PEN), flexible glass or Polyethylene terephthalate (PET).

Another objective of the preferred embodiment of the present invention is that the method further includes a step of plating nickel, tin, copper or gold or compound thereof on the first conductive element before the isolation insulation film printing step.

Another objective of the preferred embodiment of the present invention is that material for the first conductive element is selected from the group consisting of a compound of silver and Pd nanoparticle, copper and Pd nanoparticle, nano-copper, Ni—Mo—P, silver or Pd.

Still another objective of the preferred embodiment of the present invention is that nickel, tin, gold or copper or compound thereof is plated on the patterned second conductive element after the patterned second conductive element is printed on the top face of the substrate.

Still another objective of the preferred embodiment of the present invention is that a number of the first conductive element is one and a number of the patterned second conductive element is three.

A further objective of the preferred embodiment of the present invention is that there is at least one patterned second conductive element printed on the top face of the substrate.

DETAILED DESCRIPTION OF THE PREFERRED EMBODIMENT

In order to make it easy to carry out the preferred embodiment of the present invention, a detailed description of the parts of the invention, supported with figures is provided here, as each part of the preferred embodiment of the present invention has many features, it is made easy to read, by referring to each feature with a number included in the parts description text. The number of the parts feature(s) is indicated here by starting it sequentially from the number 10, wherever a part feature appears in a text, it is directly assigned its associated serial number.

Figure 1:
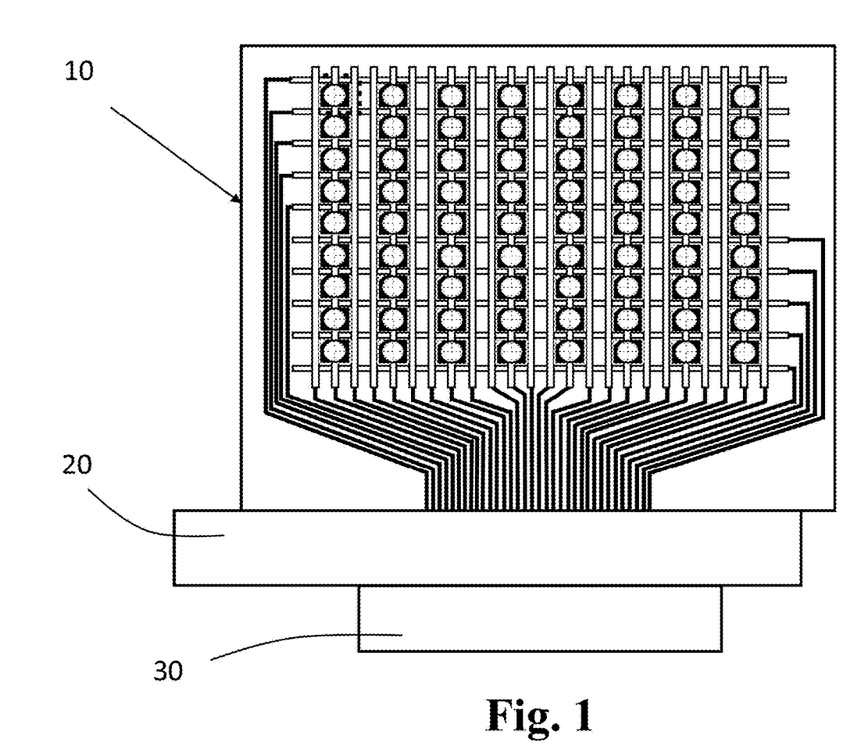
FIG. 1 is a top plan view of combination of a plurality of LED modules electrically connected together.
Figure 2A:
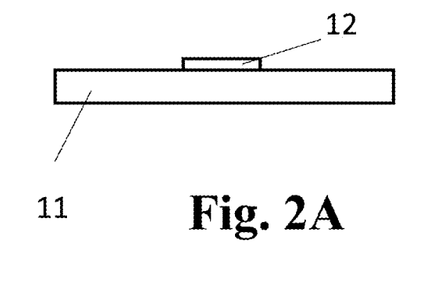
FIGS. 2A~2E are schematic cross sectional views showing steps for making an LED module of the preferred embodiment of the present invention.
Figure 2B:
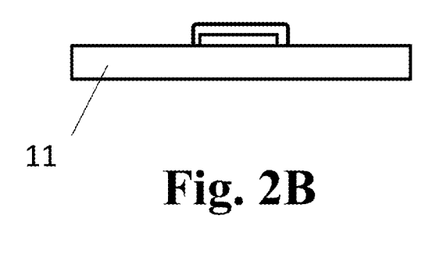
Figure 2C:
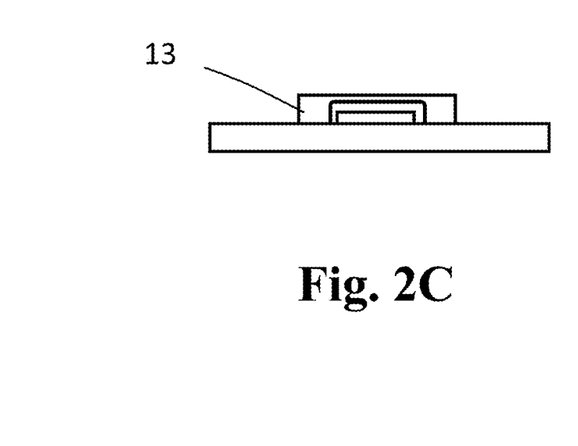
Figure 2D:
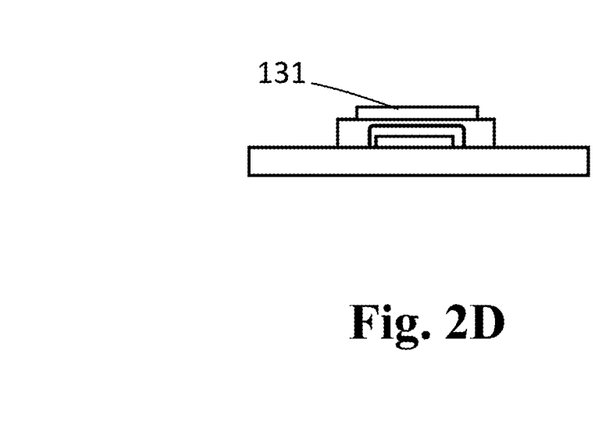
Figure 2E:
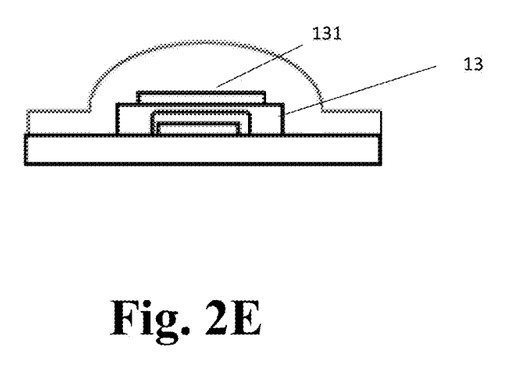

With reference to FIG. 1, an LED device constructed in accordance with the preferred embodiment of the present invention is shown and includes an LED array 10, a PCB (Printed Circuit Board) 20 electrically connected to the LED array 10 and a control module 30 electrically connected to the PCB 20. As the PCB 20 is not the subject matter to be discussed in the preferred embodiment of the present invention, and neither is the control module 30, none of which will be further addressed in the detailed description of the preferred embodiment of the present invention.

It is learned from FIGS. 2A~2E that the method involved in the preferred embodiment of the present invention includes multiple steps in different stages. A substrate 11, flexible and light transmissive, is made of a material selected from the group consisting of polyimide (PI), Polyethylene naphtholate (PEN), flexible glass, PET (Polyethylene terephthalate) or a compound thereof is prepared. After which, a pretreatment with a material selected from the group consisting of Ag/Pd nanoparticles, copper nanoparticles, NiMoP nanoparticles, Ag particles or Pd particles to a top face of the substrate 11 is printed to agitate the top face of the substrate 11. After the top face of the substrate 11 is agitated with a seed layer 12 made of the material mentioned above, a plating process is used to form a first conductive element as well as conductive islands (not numbered) with nickel, tin, copper or the compound thereof. On top of the first conductive element, a first insulation layer 13 is printed and has a width larger than that of the first conductive element. A second insulation layer 131 having a width smaller than that of the first insulation layer 13 is again printed on top of the first insulation layer 13 to completely surround and isolate the first conductive element. The first insulation layer 13 and the second insulation layer 131 on top of the first insulation layer 13 together form a trapezoidal shape to ensure that there is no electrical leakage or short when the LED device is in operation.

Another agitation process to the top face of the substrate 11 is applied with the material selected from the group consisting of Ag/Pd nanoparticles, copper nanoparticles, NiMoP nanoparticles, Ag particles or Pd particles. Then, a material selected from the group consisting of nickel, tin, copper or compound thereof is plated on areas where the agitation occurs to form on the top of the second insulation layer 131 and on the top face of the substrate 11 a patterned second conductive element. When the first conductive element and the patterned second conductive element are all formed on the top face of the substrate 11, an LED chip (not yet shown) is mounted to electrically connect to both the first conductive element and the second element.

Figure 3A:
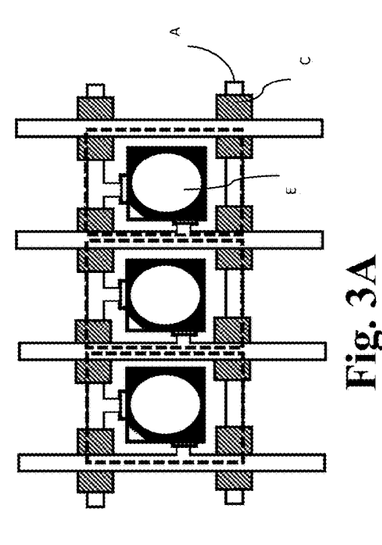
FIGS. 3A, 3B show schematic top plan views of an LED module constructed in accordance with the preferred embodiment of the present invention.
Figure 3B:
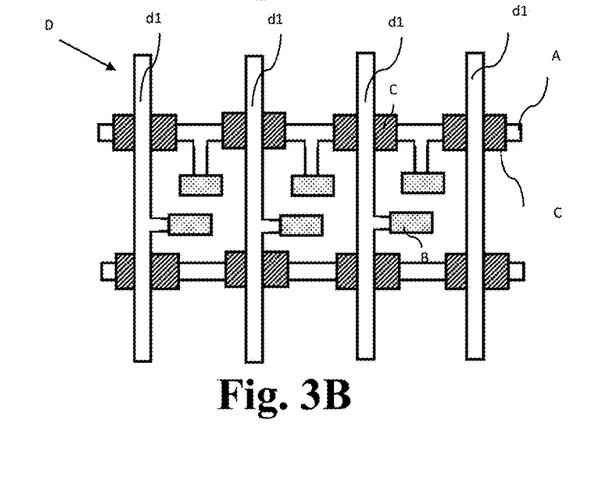

With reference to FIGS. 3A and 3B, from the steps of the method of the preferred embodiment, it is to be noted that after the first conductive element A, the conductive islands B and the patterned second conductive element D are formed in according to the steps, the LED module is composed of a first conductive element A, one patterned second conductive element, i.e., d1, passing over the first conductive element A with the insulation layer C sandwiched between the first conductive element A and the patterned second conductive element D and two conductive islands B respectively and electrically connecting to the first conductive element A and the patterned second conductive element D. After the layout are formed on the top face of the substrate, an LED chip E responsible for only one color, for example, red, green, blue or white is mounted on top of the layout to respectively and electrically connect to the two conductive islands B and the first conductive element A and the patterned second conductive element D.

Figure 4A:
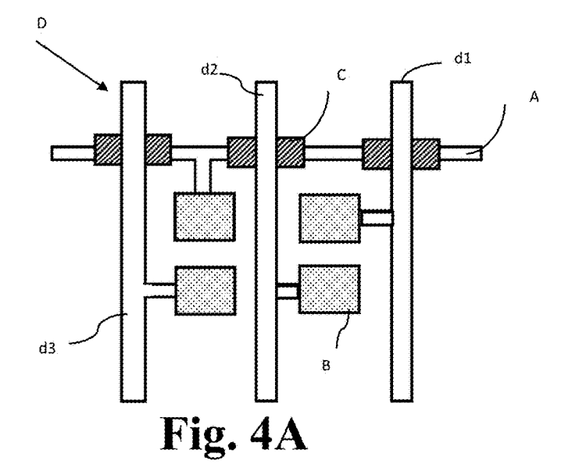
FIGS. 4A~4B are schematic top plan views showing arrangement of the first conductive element, the conductive islands and the patterned second conductive element in an LED module constructed in accordance with the preferred embodiment of the present invention.
Figure 4B:
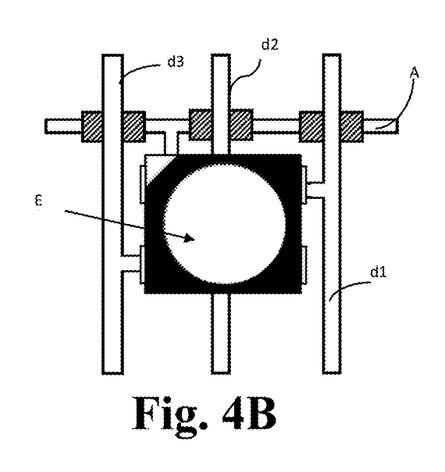

From FIGS. 4A~4B, it is noted from the previous drawings that the first conductive element A and conductive islands B are formed by firstly printed process and then plated process. After the first conductive element A and conductive islands B are formed, a patterned insulation layer C is printed on portions of the first conductive element A, then a patterned second conductive element D is formed by the steps mentioned above and crosses over the portions of the first conductive element A having thereon the insulation layer C. As can be seen from, especially, FIG. 3A, the first conductive element A is electrically connected to at least one conductive islands B and the remainder of the conductive islands B is electrically and respectively connected to a portion of the patterned second conductive element D (d1, d2, d3), wherein, in this embodiment, for example, a portion of the patterned second conductive element (d1, d2, d3) crosses over the first conductive element A and is insulated from the first conductive element A by the insulation layer C. It is further noted that the first conductive element A, the conductive islands B and a portion of the patterned second conductive element D are formed on the same surface, e.g., the top face of the substrate 11, as shown on FIG. 2A. Due to the existence of the insulation layer C, portions of the patterned second conductive element D are elevated, which makes the portions of the patterned second conductive element D higher than the first conductive element A, the conductive islands B and the remainder of the patterned second conductive element D (first patterned second conductive d1, second patterned second conductive element d2, third patterned second conductive element d3). After all the electrical connection among the first conductive element A, the conductive islands B and the patterned second conductive element D is well connected, an LED chip E is mounted to electrically connect to the first conductive element A, the conductive islands B and the patterned second conductive element D to complete the formation of the LED module of this preferred embodiment of the present invention.

Figure 5A:
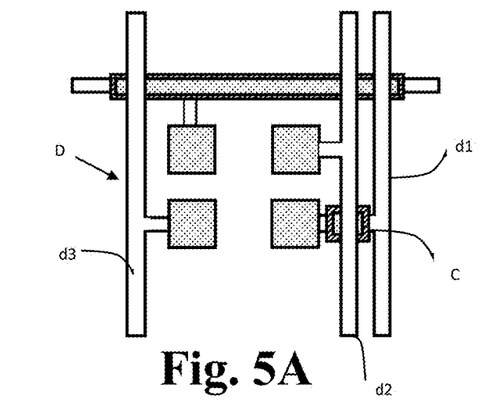
FIGS. 5A~5C are schematic top plan views showing another embodiment of the arrangement of the first conductive element, the conductive islands and the patterned second conductive element in an LED module constructed in accordance with the preferred embodiment of the present invention.
Figure 5B:
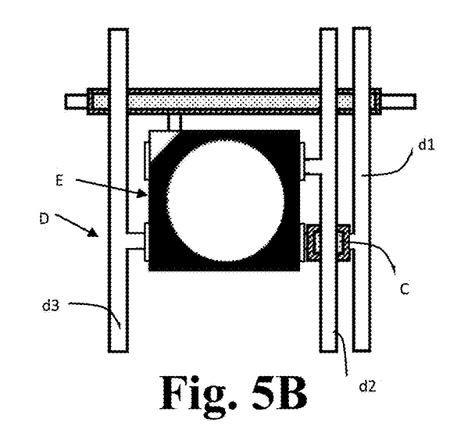
Figure 5C:
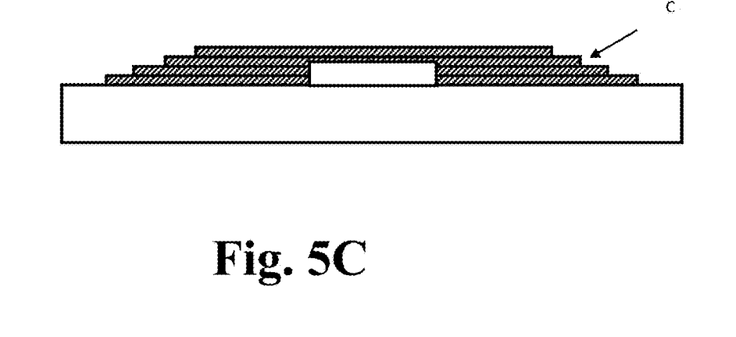

With reference to FIGS. 5A-5C and still using FIGS. 4A and 4B for reference, it is noted from FIGS. 4A, 4B that the patterned second conductive element D (d1, d2, d3) crosses over the first conductive element A and there is no mutual relationship between any two adjacent patterned second conductive elements (d1, d2, d3). However, from the depiction of FIGS. 5A and 5B, when the first patterned second conductive element d1 and the second patterned second conductive element d2, for example, are adjacent to one another, in order for the first second conductive element d1 to be electrically connecting to one of the conductive islands B, the insulation layer C is formed, printed, for example, under a portion of the bottom face of the second patterned second conductive element d2 such that when the first patterned second conductive element d1 is to be electrically connecting to one of the conductive islands B, there is no short. Of course, the LED chip E is mounted to electrically connect to the conductive islands B, the first conductive element A and the patterned second conductive element B. As for the insulation layer C, either on top of the first conductive element A or under a portion of the bottom face of the second patterned second conductive element, for example, the insulation layer C has a trapezoidal shape in cross section. From the depiction of this drawing, the insulation layer C is laminated and thus has a plurality of layers (more than two).

Figure 6A:
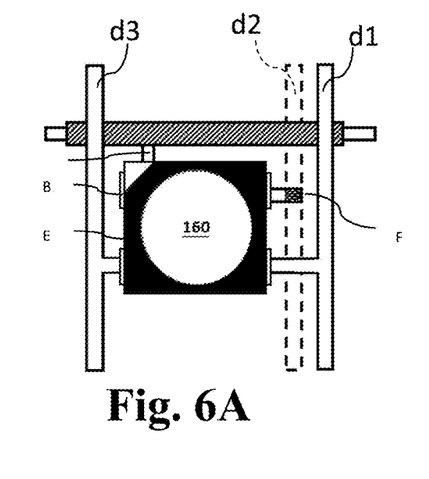
FIGS. 6A and 6B are schematic top plan views respectively showing layouts of different embodiments of the present invention.

With reference to FIG. 6A, the LED module constructed in accordance with the present invention has one patterned second conductive element, any one of d1, d2, or d3, is formed on an opposite side face, the bottom face relative to the top face of the substrate, e.g., d2 in this embodiment. In order to electrically connect to one of the conductive islands B, a via F is defined through the substrate (not shown) and filled with conductive element, such as copper or the like, to electrically connect, for example, the second patterned second conductive element d2 to one of the conductive islands B.

Figure 6B:
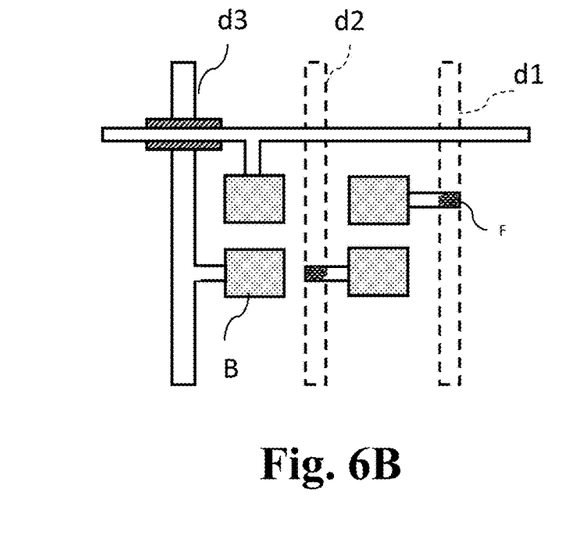
Figure 7A:
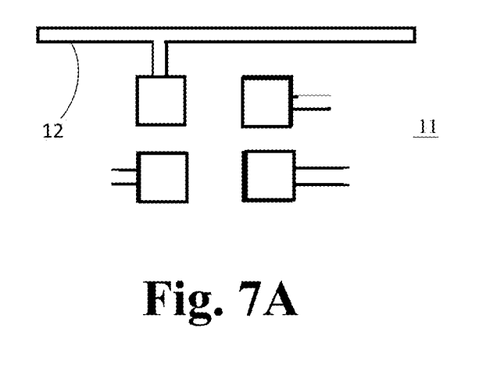
FIGS. 7A~7G are schematic top plan views showing steps of making an LED module having therein four conductive islands.
Figure 7B:
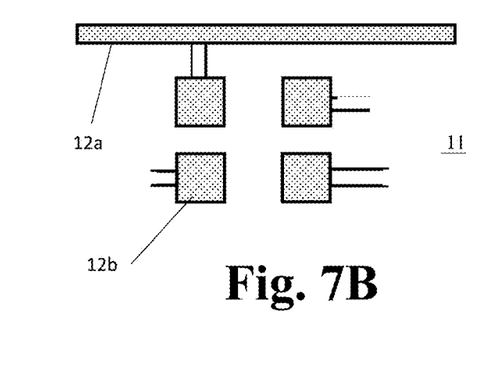
Figure 7C:
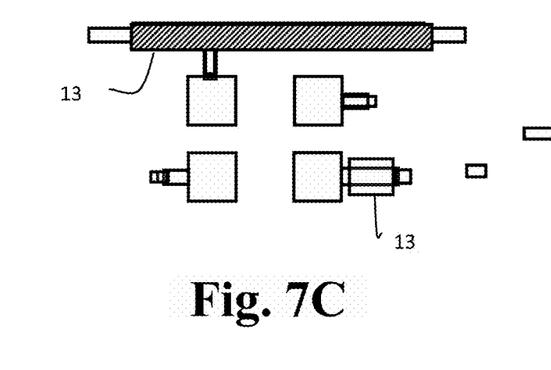
Figure 7D:
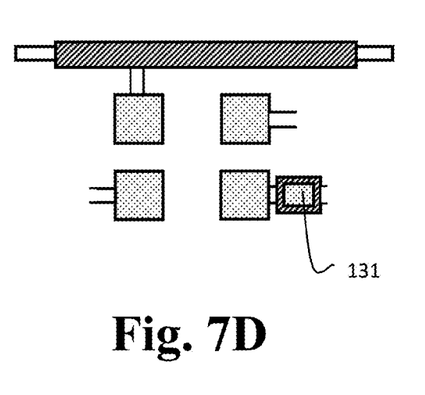
Figure 7E:
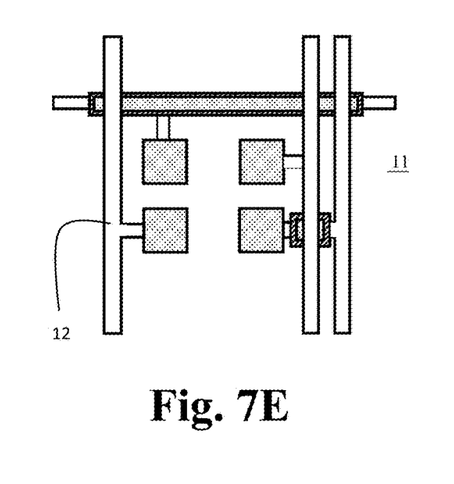
Figure 7F:
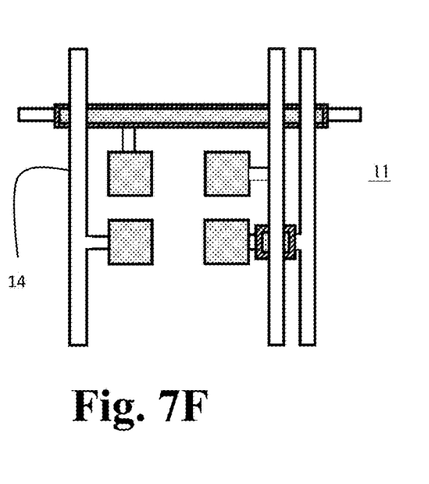
Figure 7G:
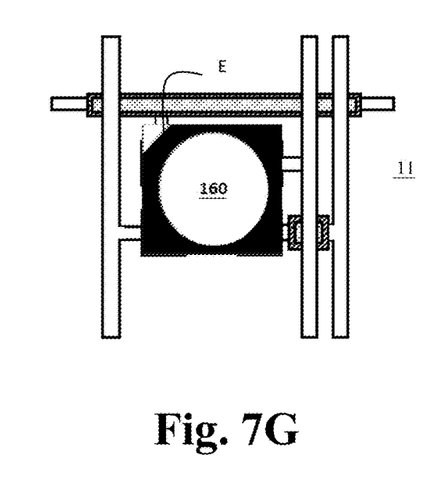

With FIG. 6B, the LED module constructed in accordance with the present invention has two patterned second conductive element, any two of d1, d2, or d3, are formed on the opposite side face, the bottom face relative to the top face of the substrate, e.g., d1, d2 in this embodiment. In order to electrically connect to two of the conductive islands B, two vias F are defined through the substrate (not shown) and filled with conductive element, such as copper or the like, to electrically connect, for example, the first patterned second conductive element d1 and the second patterned second conductive element d2 to two of the conductive islands B.

FIGS. 7A~7G, a substrate 11, flexible and light transmissive, is made of a material selected from the group consisting of polyimide (PI), Polyethylene naphtholate (PEN), flexible glass, PET (Polyethylene terephthalate) or a compound thereof is prepared. After which, a pretreatment with a material selected from the group consisting of Ag/Pd nanoparticles, copper nanoparticles, NiMoP nanoparticles, Ag particles or Pd particles to a top face of the substrate 11 is printed to agitate the top face of the substrate 11. After the top face of the substrate 11 is agitated with a seed layer 12 made of the material mentioned above, a plating process is used to form a first conductive element (12a) as well as conductive islands (12b) with nickel, tin, copper or the like. On top of the first conductive element 12a, a first insulation layer 13 is printed and has a width larger than that of the first conductive element. A second insulation layer 131 having a width smaller than that of the first insulation layer 13 is again printed on top of the first insulation layer 13 to completely surround and isolate the first conductive element. The first insulation layer 13 and the second insulation layer 131 on top of the first insulation layer 13 together form a trapezoidal shape to ensure that there is no electrical leakage or short when the LED device is in operation.

Another agitation process to the top face of the substrate 11 is applied with the material selected from the group consisting of Ag/Pd nanoparticles, copper nanoparticles, NiMoP nanoparticles, Ag particles or Pd particles. Then, a copper plating is implemented to form on the top face of the substrate 11 and on top of the second insulation layer 131 to form a patterned second conductive element 14. When the first conductive element 12a and the patterned second conductive element 14 are all formed on the top face of the substrate 11, an LED chip (E) is mounted to electrically connect to both the first conductive element 12a and the patterned second conductive element 14.

Figure 8:
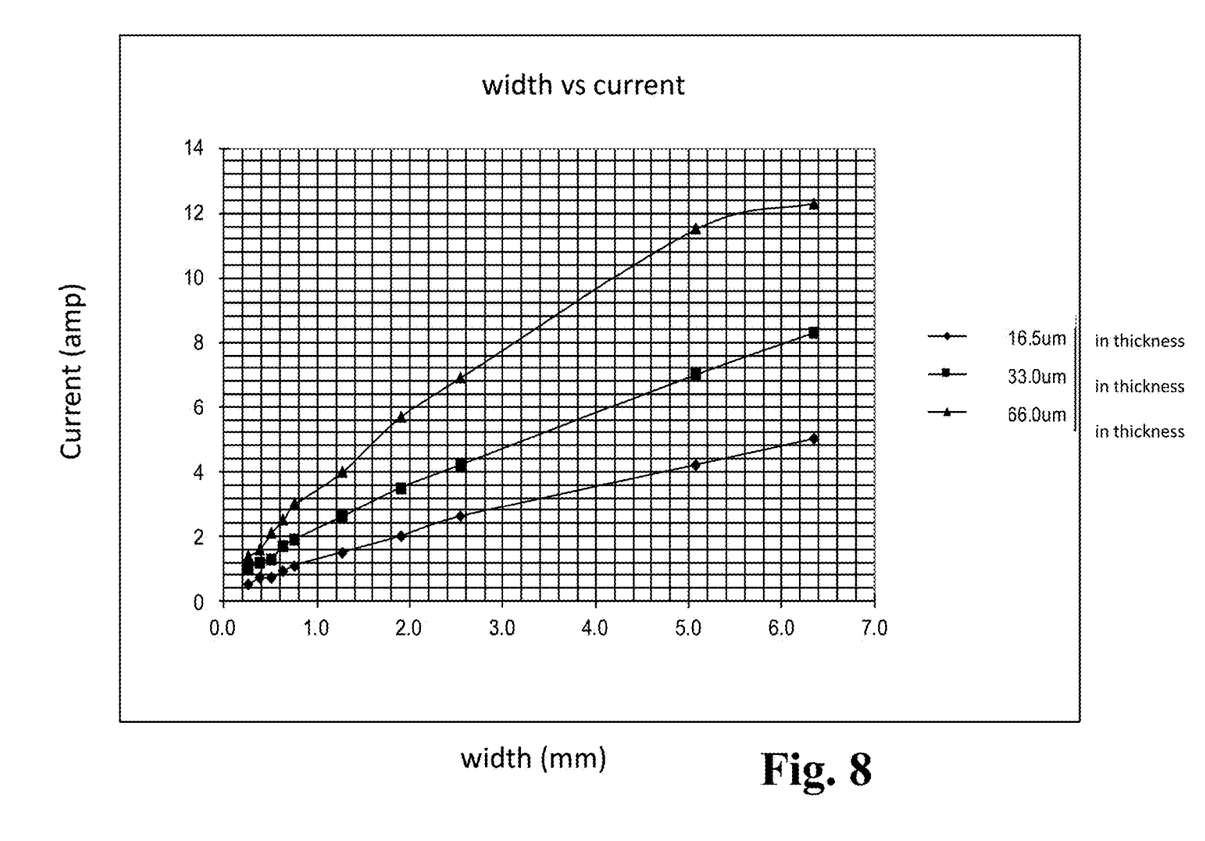
FIG. 8 is a schematic drawing showing the performance changes according to variations of the wire width.

With reference to FIG. 8, it is noted that the width of an electrical wire is closely related to the current bearing capacity passing through the wire. In order to have enough lighting and better performance to the LED module constructed in accordance with the method of the preferred embodiment of the present invention, it is learned that when the current is at least 0.3 Amps, the LED module reaches the minimum performance requirements.

From the abovementioned steps of the preferred embodiment of the present invention, it is learned that the flexibility of the substrate 11 allows the user to bend the LED module within a certain degree without the worry of breakage of the substrate 11. Still, as the substrate 11 is transparent, which increases light transmission and thus enhances lighting effect of the LED module. Still further, as the first conductive element 12a and the patterned second conductive element 14 are primarily printed on top of the substrate 11, the printing technology involved is relatively simple and easy for mass production. Allowing some of the patterned second conductive elements 14 to be formed on the opposite side of the substrate 11 increase the density of the LED chip E mounted on the substrate 11, which increases the resolution of the LED display once the LED module of the preferred embodiment of the present invention is assembled with one another.

What is claimed is:

1. A method for making a LED module comprising the steps of:
    printing a first conductive element and conductive islands on a top face of a substrate, the first conductive element having a feature to allow at least 0.3 Amps of electrical current to pass therethrough;
    printing an insulation film on top of portions of the first conductive element;
    printing a patterned second conductive element on the top face of the substrate and on top of the isolation insulation film so that a portion of the patterned second conductive element crosses over the first conductive element at the portions of the first conductive element having the insulation film thereon, such that the patterned second conductive element is on a same level as that with the first conductive element, except for the portions of the first conductive element having the insulation film thereon; and
    mounting an LED chip on the top face of the substrate, allowing the LED chip to electrically connect to the first conductive element, the conductive islands and the patterned second conductive element.

2. The method as claimed in claim 1, wherein the substrate is flexible and light transmissive and made of a compound containing PI (polyimide), PEN (Polyethylene naphtholates), flexible glass or PET (Polyethylene terephthalate).

3. The method as claimed in claim 1 further comprising a step of plating a material selected from the group consisting of nickel, tin, copper or gold or compound thereof on the first conductive element before the insulation film printing step.

4. The method as claimed in claim 1 further comprising a step of plating a material selected from the group consisting of nickel, tin, copper or gold or compound thereof on the first conductive element and on the patterned second conductive element after the patterned second conductive element is printed on the top face of the substrate.

5. The method as claimed in claim 3 further comprising a step of plating a material selected from the group consisting of nickel, tin, copper or gold or compound thereof on the patterned second conductive element after the patterned second conductive element is printed on the top face of the substrate.

6. The method as claimed in claim 1, wherein there are two conductive islands, one first conductive element electrically connected to one of the conductive islands and one patterned second conductive element electrically connected to the other one of the conductive islands on the top face of the substrate.

7. The method as claimed in claim 5, wherein one of the conductive islands, is electrically connected to the first conductive element and another of the conductive islands is electrically connected to the patterned second conductive element.

8. An LED module made according to the method claimed in claim 1, the LED module comprising:
    a substrate;
    a first conductive element formed on a top face of the substrate, wherein the first conductive element has a feature to allow at least 0.3 Amps of electrical current to pass therethrough;
    conductive islands formed on the top face of the substrate and one of which is electrically connected to the first conductive element;
    an insulation film formed on the top face of the first conductive element;
    at least one patterned second conductive element formed on the substrate electrically connected to the remainder of the conductive islands and crossing over the first conductive element at portions of the first conductive element having the insulation film formed thereon; and
    an LED chip mounted on the top face of the substrate to electrically connect to the first conductive element, the conductive islands and the patterned second conductive element.

9. The LED module as claimed in claim 8, wherein the substrate is flexible and light transmissive and made of a compound containing PI (polyimide), PEN (Polyethylene naphtholates), flexible glass or PET (Polyethylene terephthalate).

10. The LED module as claimed in claim 8, wherein one of the conductive islands is electrically connected to the first conductive element and another of the conductive islands is electrically connected to the patterned second conductive element.

11. The LED module as claimed in claim 8, wherein the number of the at least one patterned second conductive element is three, the number of the conductive islands is four and the patterned second conductive elements are electrically and respectively connected to the remaining three of the conductive islands.

12. The LED module as claimed in claim 8, wherein the first conductive element and the patterned second conductive element, respectively, are made of a compound containing a material selected from the group consisting of nickel, tin, copper or gold.

13. The LED module as claimed in claim 11, wherein one of the patterned second conductive elements is formed on a bottom face of the substrate and a via is defined through the substrate and filled with a conductive element to allow the patterned second conductive element formed on the bottom face to be electrically connected to a corresponding one of the conductive islands.

14. The LED module as claimed in claim 11, wherein two of the patterned second conductive elements are formed on a bottom face of the substrate and two vias are defined through the substrate and respectively filled with a conductive element to allow the patterned second conductive elements formed on the bottom face to be electrically connected to corresponding ones of the conductive islands.

15. The LED module as claimed in claim 8, wherein the insulation film sandwiched between the first conductive element and the patterned second conductive element has a trapezoidal cross section and is laminated.

16. The LED module as claimed in claim 11, wherein the insulation film sandwiched between the first conductive element and at least one of the patterned second conductive elements formed on the top face of the substrate has a trapezoidal cross section and is laminated.

\* \* \* \* \*